(12) United States Patent
Fisher et al.

(10) Patent No.: US 12,340,032 B2
(45) Date of Patent: *Jun. 24, 2025

(54) INSTRUMENT PANEL FOR COMPUTING SYSTEM

(71) Applicant: Baker Hughes Oilfield Operations LLC, Houston, TX (US)

(72) Inventors: Steven William Fisher, Edmonds, WA (US); Kevin Doan, Seattle, WA (US); Malgorzata Anna Blachnicka, Seattle, WA (US); Bryan Shadel, Gardnerville, NV (US)

(73) Assignee: Baker Hughes Oilfield Operations LLC, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/640,944

(22) Filed: Apr. 19, 2024

(65) Prior Publication Data

US 2024/0272728 A1 Aug. 15, 2024

Related U.S. Application Data

(63) Continuation of application No. 17/014,577, filed on Sep. 8, 2020, now Pat. No. 11,966,519.

(60) Provisional application No. 62/897,990, filed on Sep. 9, 2019.

(51) Int. Cl.
| | |
|---|---|
| *G06F 11/30* | (2006.01) |
| *G01R 31/28* | (2006.01) |
| *G05B 19/4065* | (2006.01) |
| *G05B 19/418* | (2006.01) |
| *G06F 3/03* | (2006.01) |
| *G06F 3/147* | (2006.01) |
| *H05K 7/14* | (2006.01) |

(52) U.S. Cl.
CPC ........... *G06F 3/03* (2013.01); *G01R 31/2801* (2013.01); *G05B 19/4065* (2013.01); *G05B 19/4185* (2013.01); *G06F 3/147* (2013.01); *H05K 7/1465* (2013.01); *G05B 2219/33328* (2013.01)

(58) Field of Classification Search
CPC .......................................................... G06F 3/03
See application file for complete search history.

(56) References Cited

U.S. PATENT DOCUMENTS

| | | | | |
|---|---|---|---|---|
| 6,301,123 | B1 * | 10/2001 | Nealis | H05K 7/1415 361/740 |
| 7,443,016 | B2 * | 10/2008 | Tsai | H01L 23/04 257/E21.705 |
| 11,966,519 | B2 * | 4/2024 | Fisher | H05K 7/1481 |

* cited by examiner

*Primary Examiner* — Phuong Huynh
(74) *Attorney, Agent, or Firm* — Mintz, Levin, Cohn, Ferris, Glovsky and Popeo, P.C.

(57) ABSTRACT

An instrument panel includes a frame defining an opening, a plurality of cards, and an HMI. The cards have a front face, a rear face, one or more circuits, and a data interface on the rear face in communication with the circuits. The cards include one or more first cards and one or more second cards. The first cards front face have a vertical dimension approximately equal to a vertical dimension of the opening. The second cards have a body, a nose projecting from the body defining the second cards front face, and a recess between the nose and body. The HMI includes a front face received within the opening. The first cards are positioned with the front face visible within the opening. The second cards are positioned with the nose visible within the opening and a depth of the HMI received within the recess.

20 Claims, 13 Drawing Sheets

INSTRUMENT PANEL FOR COMPUTING SYSTEM

CROSS-REFERENCE TO RELATED APPLICATIONS

This application is a continuation of U.S. patent application Ser. No. 17/014,577 entitled "Instrument Panel For Computing System," filed on Sep. 8, 2020, which claims the benefit of U.S. Provisional Patent Application No. 62/897,990, filed Sep. 9, 2019, entitled "Instrument Panel For Computing System," the entirety of each of which are incorporated by reference herein.

BACKGROUND

Many industries, such as hydrocarbon refining and power generation, can rely heavily upon operation of machinery, and in some instances, continuous operation of machinery. In these environments, failure of one or more machines can incur significant costs due to repair expenses as well as loss of production and potential injury to workers. Given these risks, it can be common to monitor certain operating parameters of one or more machine components. Measurements of the operating parameters can provide an indication of the mechanical condition of a machine component, allowing preventative maintenance (e.g., repair, replacement, etc.) to be performed on the machine component prior to failure. This monitoring can provide one or more long term benefits, such as lower production costs, reduced equipment down time, improved reliability, and enhanced safety.

SUMMARY

In an embodiment, an instrument panel is provided and can include a frame, a plurality of cards, and a human-machine interface (HMI). The frame can define an opening extending in horizontal and vertical directions. The plurality of cards can each have a front face, a rear face, one or more circuits, and a data connection interface positioned on the rear face in electrical communication with the one or more circuits. The plurality of cards can include one or more first cards and one or more second cards. The front face of the first cards can have a vertical dimension approximately equal to a vertical dimension of the frame opening. The one or more second cards can have a body, a nose projecting outward from the body and defining the front face of the one or more second cards, and a recessed portion extending between the nose and the body. The HMI can include a front face received within a portion of the frame opening. The one or more first cards can be positioned such that the front face of the first cards is visible within the frame opening. The one or more second cards can be positioned such that the nose is visible within the frame opening and the recessed portion of second cards receives a depth of the HMI extending in a direction opposite the front face of the second cards.

In another embodiment, the one or more first cards can include a power input circuit.

In another embodiment, the HMI can include a display.

In another embodiment, at least one of the second cards can include one or more lights positioned on the front surface of the second card that is in communication with the one or more circuits and configured to indicate a status of the second card by at least one of color or duty cycle.

In another embodiment, at least one of the second cards can include one or more data interfaces positioned on the front surface of the second card that are in communication with the one or more circuits.

In another embodiment, the one or more second cards can further include a first data connector mounted to the body and configured to couple to a second data connector mounted to the HMI to form a data connection pathway for exchange of data between the one or more second cards and the HMI.

In another embodiment, the front faces of respective ones of the first cards, the second cards, and the HMI can be positioned within the opening as follows. The one or more first cards can be positioned adjacent to a left side of the frame. The one or more second cards can be positioned rightwards of the first cards with the nose of respective ones of the second cards adjacent to a top of the frame. The HMI can be positioned rightward of the one or more first cards and below the second cards.

In another embodiment, the front faces of respective ones of the first cards, the second cards, and the HMI can be positioned within the opening as follows. The one or more first cards can be positioned adjacent to a left side of the frame. The one or more second cards a can be re positioned rightward of the first cards with the nose of respective ones of the second cards adjacent to a bottom of the frame. The HMI can be positioned rightward of the one or more first cards and above the second cards.

In another embodiment, the front faces of respective ones of the first cards, the second cards, and the HMI can be positioned within the opening as follows. The one or more first cards can be positioned adjacent to a left side of the frame. The one or more second cards can be positioned rightward of the first cards with the nose of respective ones of the second cards adjacent to a top of the frame. The HMI can be positioned rightward of the one or more first cards and below the second cards.

In another embodiment, the front faces of respective ones of the first cards, the second cards, and the HMI can be positioned within the opening as follows. The one or more first cards can be positioned adjacent to a right side of the frame. The one or more second cards can be positioned leftward of the first cards with the nose of respective ones of the second cards adjacent to a bottom of the frame. The HMI can be positioned leftward of the one or more first cards and above the second cards.

In another embodiment, the front faces of respective ones of the first cards, the second cards, and the HMI can be positioned within the opening as follows. The one or more first cards can be positioned inward from the right and left sides of the frame. The one or more second cards can include a plurality of second cards. A first portion of the plurality of second cards can be positioned leftward of the first cards and a second portion of the plurality of second cards can be positioned rightward of the first cards. The nose of respective ones of the plurality of second cards can be adjacent to a top of the frame. The HMI can include a first HMI and a second HMI. The first HMI can be positioned rightward of the first cards and the second HMI can be positioned leftward of the one or more first cards. The first and second HMI can be further positioned below the second cards.

In another embodiment, the front faces of respective ones of the first cards, the second cards, and the HMI can be positioned within the opening as follows. The one or more first cards can be positioned inward from the right and left sides of the frame. The one or more second cards can include a plurality of second cards. A first portion of the plurality of second cards can be positioned leftward of the first cards and a second portion of the plurality of second cards can be positioned rightward of the first cards. The nose of respective ones of the plurality of second cards can be adjacent to a bottom of the frame. The HMI can include a first HMI and a second HMI. The first HMI can be positioned rightward of the first cards and the second HMI can be positioned leftward of the one or more first cards. The first and second HMI can be further positioned above the plurality of second cards.

DESCRIPTION OF DRAWINGS

These and other features will be more readily understood from the following detailed description taken in conjunction with the accompanying drawings, in which.

It is noted that the drawings are not necessarily to scale. The drawings are intended to depict only typical aspects of the subject matter disclosed herein, and therefore should not be considered as limiting the scope of the disclosure.

DETAILED DESCRIPTION

Industrial machinery, such as wind turbines, can be monitored by monitoring systems to ensure operation within acceptable tolerances. In general, machine monitoring can include measuring operating parameters of one or more of the machine components, determining whether the machine components are operating properly from the operating parameter measurements, and issuing warnings if a machine component is determined to be operating improperly. These warnings can allow corrective action to taken in advance of machine failure, providing benefits such as lower production costs, reduced equipment down time, improved reliability, and/or improved safety.

However, existing monitoring systems can be relatively inflexible. As an example, manufacturers can make different types of monitoring systems that have different capabilities, referred to as models or implementations. Different monitoring system implementations can include components (e.g., inputs, outputs, processors, etc.) that are designed for use only with their specific implementation. The inability to share components between different monitoring system implementations can require development of new components for each new implementation, rather than utilizing already created components and can slow the deployment of new monitoring system implementations. In another example, different monitoring system implementations can require more resources (e.g., spare hardware and software, trained personnel, etc.) to manage, as each can include different specialized components that can behave differently.

Accordingly, embodiments of the disclosure provide flexible monitoring systems including circuits that can share a common architecture (e.g., hardware, software, firmware, etc.) and that can be configured to perform different designated functions (e.g., input, processing, output, system operation, etc.). By separating functions of the flexible monitoring system into different circuits, new implementations of the flexible monitoring system can be developed, in some cases rapidly, by arranging already created circuits in different combinations. This common component architecture can also reduce the amount of resources needed to manage multiple implementations of the flexible monitoring system, as each implementation can include components in common.

Embodiments of systems and corresponding methods for monitoring industrial machines are discussed herein. However, embodiments of the disclosure can be employed for monitoring other machines without limit.

Figure 1:
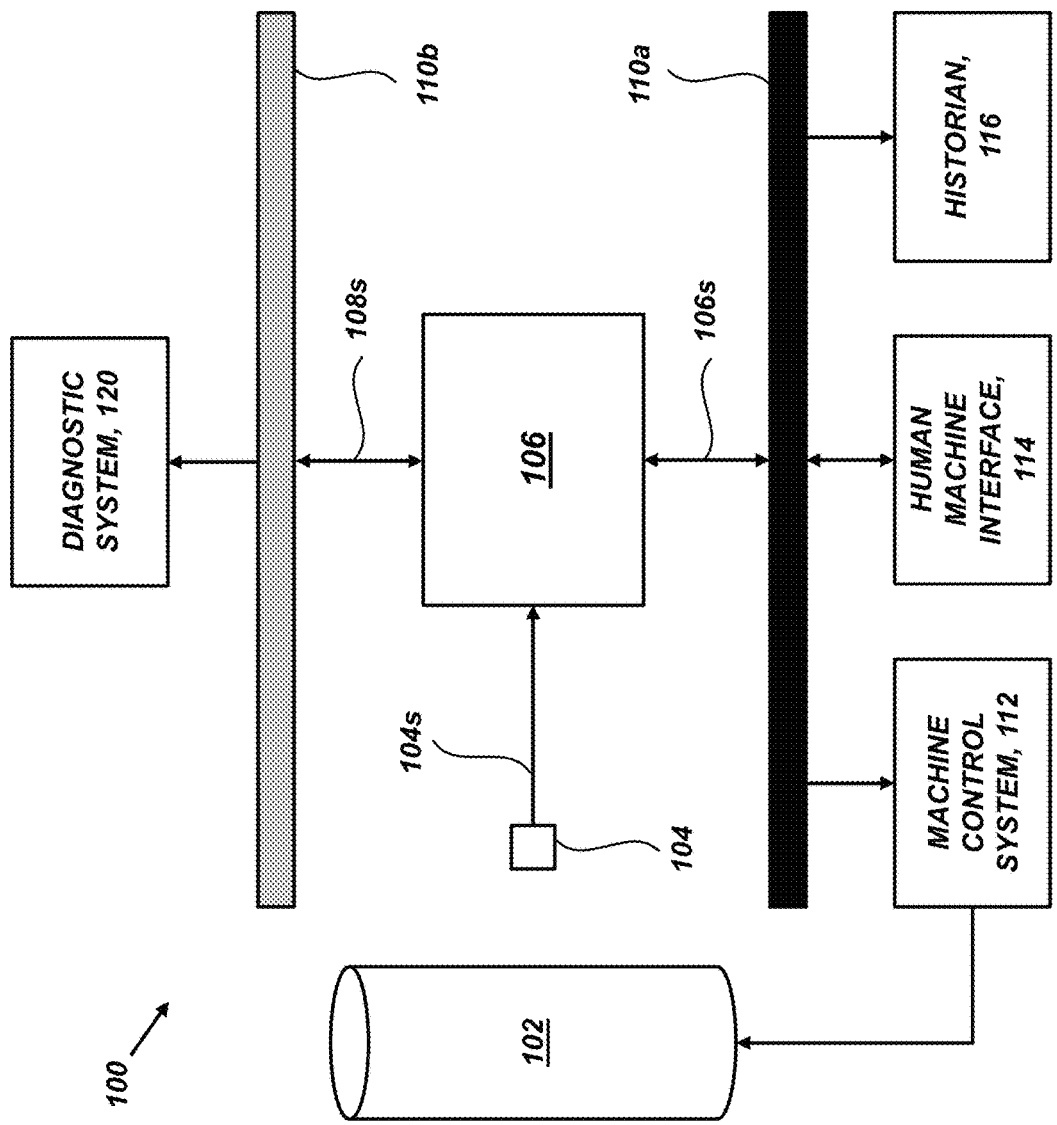
FIG. 1 is a diagram illustrating one exemplary embodiment of an operating environment containing an existing monitoring system.

An operating environment 100 containing a monitoring system is illustrated in FIG. 1 and can include a target 102, at least one sensor 104, and a monitoring system 106 in communication with the sensor 104, an internal network 110a, and an external network 110b. The target 102 can be any component of any machine. Examples of the target 102 can include gears, bearings, and shafts, amongst others. Examples of machines can include turbomachines, turbines (e.g., hydro, wind, etc.), generators, and reciprocating compressors.

The sensor 104 can be configured to sense an operating parameter of the target 102, to generate at least one sensor signal 104s representing the measured operating parameter, and to transmit the sensor signal 104s to the monitoring system 106 (e.g., via field wiring). As an example, the sensor 104 can include a probe, a transducer, and a signal conditioning circuit (not shown). The probe can interact with the target 102 for measurement of the operating parameter. The transducer can convert measurements of the operating parameter into an electrical signal (e.g., a voltage). The signal conditioning circuit can condition and/or amplify the electrical signal to generate the sensor signal 104s (e.g., a voltage ranging between a minimum and maximum). Thus, in one aspect, the sensor signal 104s can contain the direct or raw measurement made by the sensor transducer. The sensor signal 104s can be an analog signal or a digital signal.

In another aspect, the sensor signals 104s can also include an enhanced data set, in addition to the direct measurements of the operating parameter. The enhanced data set can contain a variety of measured variables that depend upon the type of operating parameter being measured. As an example, the target 102 can be a rotating component, such as a shaft, and radial vibration can be a variable measured by a sensor 104 in the form of a proximity sensor. Under these circumstances, the enhanced data set can include one or more of a gap voltage, a 1× filtered amplitude, a 2× filtered amplitude, a 1× filtered phase, a 2× filtered phase, Not 1× amplitude, and maximum shaft displacement (Smax). Gap voltage is the voltage output by the probe and represents the physical distance between the target 102 and a tip of the probe. 1× amplitude is the amplitude of vibrations having the same frequency as the shaft rotation, while 2× amplitude is the amplitude of vibrations having a frequency twice that of the shaft rotation. For instance, a rotation speed of 1480 revolutions per minute corresponds to a frequency of 24.66 cycles per second (Hz). Phase is the time delay between a vibration measured at a predetermined measurement location with respect to a reference location. Thus, 1× phase refers to phase of vibrations having the same frequency as the shaft rotation, while 2× phase refers to phase of vibrations having a frequency twice that of the shaft rotation. Not 1× amplitude refers to all amplitudes except for the 1× amplitude. In other embodiments, the enhanced data set can include metadata regarding one or more components of the sensor 104, such as the transducer. Examples of metadata can include one or more of a serial number, revision number, operating temperature, and state of health.

The number and type of sensor 104 can be dictated by the operating parameter(s) that are intended to be measured. In one aspect, the sensor 104 can take the form of one or more proximity probes for measurement of vibration, position, speed, direction of motion, and eccentricity. In another aspect, the sensor 104 can take the form of one or more accelerometers for measurement of seismic vibration and acceleration. In a further aspect, the sensor 104 can take the form of one or more temperature probes or pressure probes for measurement of temperature and pressure, respectively. It can be understood that the sensor types and corresponding operating parameters listed above are not exhaustive and embodiments of the sensor 104 can include any sensor or combination of sensors suitable for measurement of operating parameters of interest.

In use, the monitoring system 106 can be configured to process the received sensor signals 104s and output monitoring signals 106s, 108s. As an example, the monitoring system 106 can be configured to determine a value characterizing an operating parameter measurement. The monitoring system 106 can also compare this determined value, and/or any measured variables of the enhanced data set, to one or more corresponding predetermined alarm conditions in real-time and determine an alarm status (e.g., OK, not OK, alert, danger, etc.). For instance, when the target 102 is a rotating shaft and the measured operating parameter is radial vibration of the shaft, the sensor signal 104s can include measurements of displacement of the shaft as a function of time. From the sensor signal 104s, the monitoring system 106 can determine the value of vibration amplitude from the peak-to-peak displacement.

The monitoring system 106 can also be configured to output monitoring signals 106s, 108s to the internal network 110a and/or the external network 110b. The output monitoring signals 106s, 108s can include one or more of the measured variables of the enhanced data set, the determined values, and the determined status. Alarm statuses, such as alert and danger, can be annunciated via physical relays on the monitoring system 106 or to the external systems 110 by the monitoring signals 106s, 108s. In another aspect, the monitoring system 106 can additionally or alternatively store the sensor signals 104s for later processing.

The internal network 110a can be a plant network that is in communication with a machine control system 112. The machine control system 112 can be configured to provide commands to a machine operative to control one or more operating parameters of the target 102. The internal network 110a can also be in communication with other systems, such as computing devices executing configuration software (not shown), human-machine interfaces (HMIs) 114 and/or a customer historian 116. The configuration software can be used to provide configuration information, such as the pre-determined alarm conditions, to the monitoring system 106. The HMI 114 can be one or more computing devices in communication with user interface devices (e.g., displays) allowing an operator of the machine to review measured operating parameters and/or provide instructions to the machine control system 112.

So configured, the monitoring system 106 can facilitate protection of a machine containing the target 102. As an example, in response to annunciation of an alarm status, the machine control system 112 can be utilized to control operation of the target 102 (e.g., automatically according to programmed logic or manually using the HMI 114) to cause the measured operating parameters to change and move out of the alarm status. Under extreme circumstances, the machine control system 112 can be employed to shut down operation of the machine to protect the target 102 from damage and/or workers from injury. The historian 116 can store any of the data contained within the monitoring signals 106s.

The external network 110b can be a business network that is in communication with a diagnostic system 120. The diagnostic system 120 can analyze any of the data contained within the monitoring signals 108s received from the monitoring system 106 to diagnose improper operation of the target 102 and/or predict improper operation of the target 102 before it occurs. Thus, by providing monitoring signals 108s to the external network 110b, the monitoring system 106 can facilitate condition monitoring of the target 102.

Figure 2A:
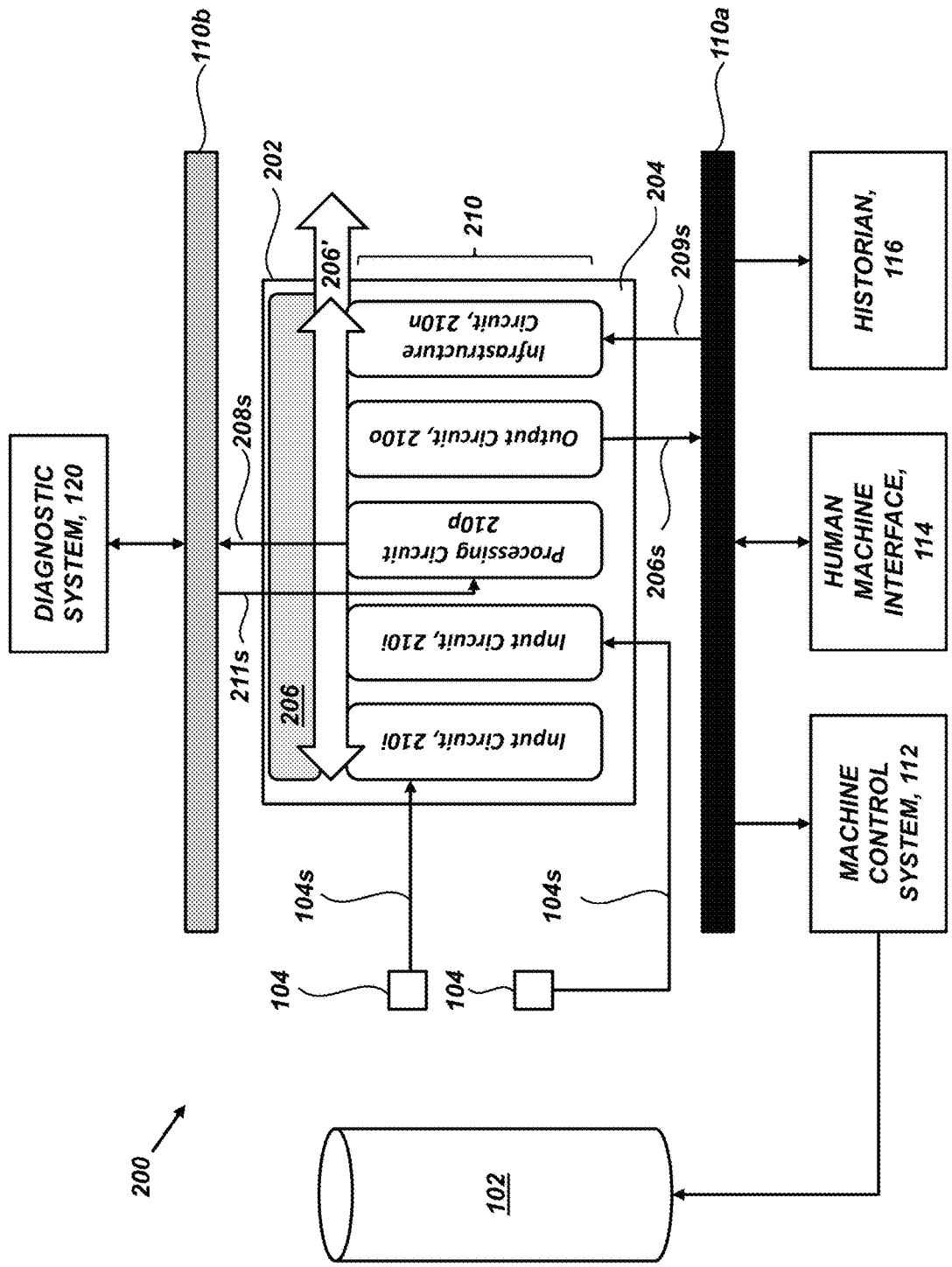
FIG. 2A is a diagram illustrating one exemplary embodiment of an operating environment containing a flexible monitoring system configured to monitor a machine.

FIG. 2A illustrates an exemplary embodiment of an operating environment 200 including the monitoring system 106 in the form of a flexible monitoring system 202. Embodiments of the flexible monitoring system 202 are discussed in detail in U.S. patent application Ser. No. 15/947,760, filed Apr. 6, 2018, entitled "Flexible and Scalable Monitoring Systems For Industrial Machines," and Ser. No. 15/947,762, filed Apr. 6, 2018, entitled "Monitoring Systems For Industrial Machines Having Dynamically Adjustable Computational Units," the entirety of each of which is incorporated by reference.

As shown, the flexible monitoring system 202 includes a base 204 containing a backplane 206, and one or more circuits 210. The backplane 206 can be configured to communicatively couple with two or more circuits 210 and receive data from at least one circuit 210 coupled thereto. As discussed herein, data transmitted to the backplane 206 can be referred to as monitoring data. In one aspect, monitoring data can include information contained within the sensor signals 104s, such as measured operating parameters of the target 102 and measured variables of the enhanced data set. Monitoring data can also include any values, statuses, and/or annunciated alarms that are determined based upon the measured operating parameters of the target 102 and/or measured variables of the enhanced data set. Circuits 210 coupled to the backplane 206 can retrieve monitoring data from the backplane 206. In certain embodiments, the backplane 206 can be passive. A passive backplane can contain substantially no or no logical circuitry that performs computing functions. Desired arbitration logic can be placed on daughter cards (e.g., one or more of the circuits 210) plugged into or otherwise communicatively coupled to the passive backplane.

The circuits 210 can be designed with a common architecture that is programmable to perform different predetermined functions of the flexible monitoring system 202. Sensor signals 104s received by one or more of the circuits 210 can be transmitted to the backplane 206 and monitoring data represented by the sensor signals 104s can be accessed by any circuit 210. This uniform architecture can reduce the number of deployed implementations of the flexible monitoring system 202 and allow sharing of monitoring circuits 210 between different implementations of the flexible monitoring system 202, each of which can reduce maintenance and system costs. The same look and feel can also be maintained across all implementations of the flexible monitoring system 202, which can reduce confusion during operation and upkeep.

Furthermore, the flexible monitoring system 202 can include multiple bases 204 that are communicatively coupled in a manner that establishes a common backplane 206' between respective bases 204 (e.g., a logical backplane). This common backplane 206' can be formed from the individual backplanes 206 of each base 204. Thus, each monitoring circuit 210 can communicate along the common backplane 206' and is not limited to sending data to and/or receiving data from the backplane 206 to which it is physically coupled.

Additionally, as discussed below, the computational units of the flexible monitoring system 202, referred to herein as processing circuits, can be separated from the input circuits that receive sensor signals 104s. As a result, the number of processing circuits that are coupled to the backplane 206 can be independent from the number of input circuits coupled to the backplane 206. The ability of monitoring circuits 210 to communicate across different bases 204, in combination with the ability to share monitoring circuits 210 between different implementations of the flexible monitoring system 202, can allow processing circuits to be added or removed for adjustment of the amount of available processing power independently of the received sensor signals 104s.

Figure 2B:
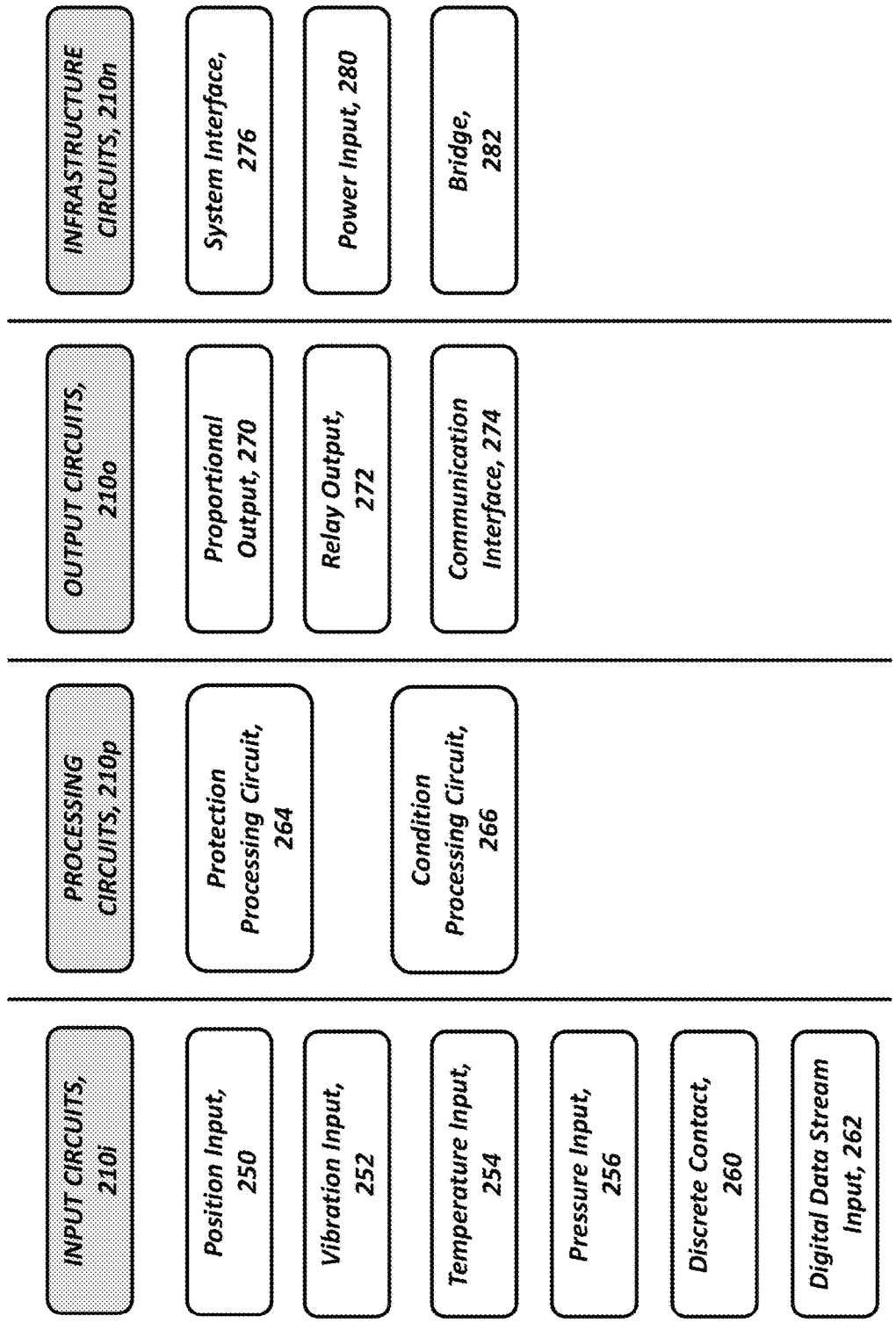
FIG. 2B is a diagram illustrating exemplary embodiments of circuits configured for use with the flexible monitoring system of FIG. 2A.
Figure 3:
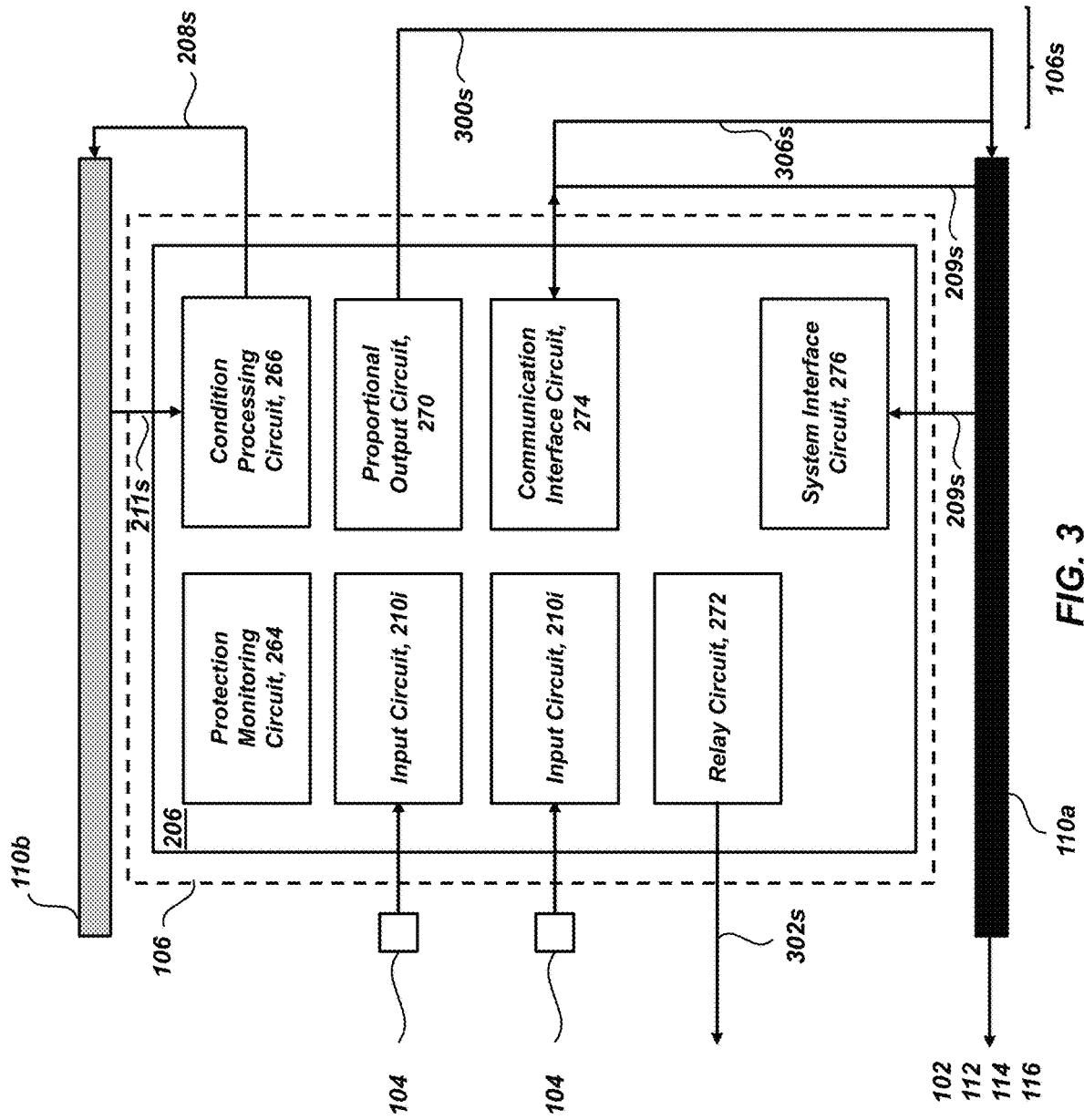
FIG. 3 is a diagram illustrating one exemplary embodiment of a backplane of the flexible monitoring system of FIG. 2A.

Exemplary embodiments of circuits 210 are illustrated in FIGS. 2A, 2B, and 3 and are discussed in detail below. As an example, the circuits 210 can include one or more of input circuits 210i, processing circuits 210p, output circuits 210o, or infrastructure circuits 210n. It can be understood, however, that the circuits 210 can be programmed to perform other functions. Further discussion of the circuits 210 can also be found in U.S. patent application Ser. No. 15/947,716 entitled "Gated Asynchronous Multipoint Network Interface Monitoring System," the entirety of which is incorporated by reference. Accordingly, the flexible monitoring system 202 can be configured to receive sensor signals 104s and output monitoring signals 206s, 208s to the internal and external networks 110a, 110b, respectively. As discussed in detail below, further embodiments of the flexible monitoring system 202 can receive command signals 209s, 211s from the internal and external networks 110a, 110b, respectively, without compromising security of the machine control system 112. As a result, the flexible monitoring system 202 can be a suitable replacement for existing deployments of monitoring systems while providing improved flexibility and functionality.

With this architecture, the circuits 210 can be combined in various ways on one or more backplanes 206 to form different implementations of the flexible monitoring system 202. The number of bases 204, input circuits 210i, processing circuits 210p, output circuits 210o, and infrastructure circuits 210n included in a given implementation of the flexible monitoring system 202 can also be varied independently of one another. In some implementations, the flexible monitoring system 202 can be in the form of a single base 204 including circuits 210 configured to provide signal input, signal output, protection monitoring, condition monitoring, and combinations thereof. In other implementations, the flexible monitoring system 202 can be in the form of at least two bases 204 and circuits 210 configured to perform any combination of signal input, signal output, protection monitoring, and condition monitoring can be distributed between the at least two bases 204. In this manner, the input, processing, and output capabilities of the flexible monitoring system 202, as well as the physical location of different circuits 210 of the flexible monitoring system 202, can be tailored to specific monitoring applications.

Furthermore, implementations of the flexible monitoring system 202 can be modified after initially deployed to modify the circuits 210 coupled to a given base 204 in the event that the intended monitoring application changes. Given their common architecture, circuits 210 can be easily added to a base 204 having capacity to couple to a new circuit 210. Alternatively, one or more new bases 204 can be communicative coupled to an existing base 204, allowing one or more new circuits 210 to be couple to respective backplane(s) 206 of the new base(s) 204 and expanding the monitoring capabilities of the flexible monitoring system 202. In some instances, circuits 210 removed from one base 204 of the flexible monitoring system 202 can be stored in reserve as spares or redeployed to another base 204 of the same or a different implementations of the flexible monitoring system 202, which may be beneficial.

In certain embodiments, input circuits 210i can be configured to receive sensor signals 104s, perform signal conditioning on the sensor signals 104s, and output the conditioned sensor signals 104s to the backplane 206. In contrast to the monitoring system 106 of FIGS. 1A-1B, the input circuits 210i can be decoupled from processing circuits 210p, allowing the number of input circuits 210i of the flexible monitoring system 202 to be varied independently of the number of processing circuits 210p.

The sensor signals 104s can be received from a variety of different types of sensors 104. Examples of sensor types can include, but are not limited to, vibration sensors, temperature sensors (e.g., resistance temperature detectors or RTD), position sensors, and pressure sensors. Notably, the ability of the input circuits 210i to transmit sensor signals 104s to the backplane 206/common backplane 206' can decouple the input circuits 210i from any specific processing circuits 210p, allowing any one or more of the processing circuits 210p to perform analysis on any measured operating parameters, in some embodiments.

Embodiments of the flexible monitoring system 202 can include one or more input circuits 210i. As shown in the FIG. 2A, the flexible monitoring system 202 includes two input circuits 210i. Each of the input circuits 210i can be in communication with a respective sensor 104 for receipt of a corresponding sensor signal 104s (e.g., acquired by a first sensor). As an example, one sensor signal 104s can represent first monitoring data including measurements of a first operating parameter of a first machine component. The other sensor signal 104s can represent second monitoring data including measurements of a second operating parameter of a second machine component (e.g., acquired by a second sensor, different from the first sensor). In certain embodiments, the first and second machine components can be the same (e.g., the target 102). In other embodiments, the first and second machine components can be different (e.g., the target 102 and a different target [not shown]). Similarly, in some embodiments, the first and second operating parameters can be the same operating parameter. In one aspect, this configuration can provide redundancy in case of failure of one of the sensors 104. In another aspect, this configuration can be utilized where a desired measurement (e.g., shaft rotation speed) is derived from two sensor measurements coordinated in time (phase). In additional embodiments, the first and second operating parameters can be different. While two input circuits 210*i* have been illustrated and discussed, other embodiments of the monitoring system can include greater or fewer input circuits.

Different types of sensors 104 can generate sensor signals 104*s* in different formats, and the input circuits 210*i* can be programmed to perform signal conditioning appropriate to the different sensor signals 104*s* before transmitting conditioned sensor signals to the backplane 206. Non-limiting embodiments of the input circuits 210*i* are illustrated in FIG. 2B. As an example, a sensor signal 104*s* received from a position sensor can be received by a position input circuit 250. A sensor signal 104*s* received from a vibration sensor can be received by a vibration input circuit 252. A sensor signal 104*s* received from a temperature sensor can be received by a temperature input circuit 254. A sensor signal 104*s* received from a pressure sensor can be received by a pressure input circuit 256.

In other embodiments, the input circuit 210*i* can be in the form of a discrete contact circuit 260. The discrete contact circuit 260 can include a pair of contacts that can be closed by an external switch or relay. The pair of contacts can be closed by the machine control system 112 or by an operator of the machine control system 112 closing a switch. The discrete contact circuit 260 can be used to change the behavior of the flexible monitoring system 202. Examples of behavior changes can include, but are not limited to, a different mode of machine operation, causing the flexible monitoring system 202 to inhibit alarm determination, and resetting alarm states.

While the monitoring system 106 can include a discrete contact, it can lack specificity. As an example, changes effected by closing a discrete contact in the monitoring system 106 can be effected upon all alarms generated by the monitoring system 106. In contrast, because the discrete contact circuit 260 of the flexible monitoring system 202 are separate from the protection processing circuit 264, the discrete contact circuit 260 can be configured to effect only selected alarm determinations and/or reset alarm states, or effect.

In further embodiments, the input circuit 210*i* can be in the form of a digital data stream input circuit 262. As an example, the digital data stream input circuit 262 can be configured to receive digital data streams from the sensor 104, the machine control system 112, and/or a trusted third-party system, as opposed to an analog data stream (e.g., from sensor 104).

Processing circuits 210*p* can be configured to retrieve any data from the backplane 206, analyze the retrieved operating parameters, and output the results of such analysis. In certain embodiments, as shown in FIG. 2B, the processing circuits 210*p* can be configured to perform protection functions and can be referred to as protection processing circuits 264 herein. In other embodiments, the processing circuits 210*p* can be configured to retrieve selected data from the backplane 206 and transmit the retrieved information to the diagnostic system 120 for performing diagnostic and/or predictive functions (e.g., condition monitoring) and can be referred to as condition processing circuits 266 herein.

The number of processing circuits 210*p* and input circuits 210*i* included in a given implementation of the flexible monitoring system 202 can be varied independently of the one another. In certain embodiments, processing circuits 210*p* can be added to the backplane 206 or removed from the backplane to tailor the amount of computing resources available for protection monitoring and/or condition monitoring. In other embodiments, a given processing circuit 210*p* can be replaced by another processing circuit 210*p* having greater or less computing power.

Any of these scenarios can be beneficial under certain circumstances, providing computational flexibility to the flexible monitoring system 202 that can be tailored to a given application and/or modified as needed. In one instance, machines having relatively low importance can have higher cost pressures and lower processing requirements. In this circumstance, an implementation of the flexible monitoring system 202 can include processing circuits 210*p* having processing resources tailored for cost. In another instance, a particular monitoring application can require high processing requirements (e.g., for determining values characterizing the measured parameters, for output of monitoring data, etc.). In this circumstance, an implementation of the flexible monitoring system 202 can include processing circuits 210*p* having processing resources tailored for processing resources. Thus, the architecture of the flexible monitoring system 202 can allow adaptation for different use cases depending upon the priorities of the intended monitoring application.

The protection processing circuits 264 and the condition processing circuits 266 are discussed below with reference to different functionalities. However, protection processing circuits 264 can be programmed to perform any function of the condition processing circuits 266. Condition processing circuits 266 can be programmed to perform functions of the protection processing circuits 264, except for transmitting data to the backplane 206 and providing local storage. The ability to inhibit the condition processing circuit 266 from transmitting data to the backplane 206 can inhibit unauthorized intrusion and facilitate protection of the internal network 110*a* and machine control system 112.

Protection processing circuits 264 can be configured to retrieve selected monitoring data from the backplane 206 in response to receipt of a protection command. As an example, one or more protection commands can be transmitted to protection processing circuits 264 in the form of protection command signal 209*s* received from the internal network 110*a* (e.g., from an operator of the machine control system 112). The selected monitoring data can include at least a portion of the monitoring data transmitted to the backplane 206. The monitoring data transmitted to the backplane can be received from an input circuit 210*i* or another protection processing circuit 264. The protection processing circuits 264 can also be configured to determine a value characterizing the selected monitoring data and transmit the determined value to the backplane 206 as additional monitoring data.

The protection processing circuit 264 can be configured to determine a status for the selected monitoring data based upon a comparison of the determined value, another determined value retrieved from the backplane 206 (e.g., from another protection processing circuit 264), and combinations thereof, with one or more predetermined set points. Predetermined set points can correspond to respective alarm conditions (e.g., an Alert condition, a Danger condition, etc.). Continuing the example above, where the determined value is an amplitude of a radial vibration, the one or more set points can include an Alert set point, a Danger set point that is greater than the Alert set point, and combinations thereof. In certain embodiments, a single set point can be employed. Assuming the use of Alert and Danger set points, if the radial vibration amplitude value is less than the Alert set point, the status of the radial vibration amplitude can be determined as "OK." If the radial vibration amplitude value is greater than or equal to the Alert set point, the status of the radial vibration amplitude can be determined as "Alert." If the radial vibration amplitude value is greater than the Danger set point, the status of the operating parameter can be determined as "Danger." After the status of the selected monitoring data is determined in this manner, the protection processing circuit 264 can transmit the determined status to the backplane 206.

The number of protection processing circuits 264 present in the flexible monitoring system 202 can be varied independently of the input circuits 210$i$. In certain embodiments, protection processing circuits 264 can be added to increase computing resources available to the flexible monitoring system 202. In other embodiments, protection processing circuits 264 can be removed or replaced to decrease computing resources available to the flexible monitoring system 202. Each can be beneficial under certain circumstances, providing computational flexibility to the flexible monitoring system 202.

The condition processing circuit 266 can be configured to retrieve selected monitoring data from the backplane 206 and to provide the retrieved monitoring data to the external network 110$b$ for use by diagnostic system 120. In certain embodiments, the selected monitoring data can be retrieved by the condition processing circuit 266 in response to receipt of a conditioning command. As an example, one or more conditioning commands can be transmitted to condition processing circuits 266 in the form of conditioning command signals 211$s$ can be received from the external network 110$b$. (e.g., from an operator of the diagnostic system 120). In turn, the diagnostic system 120 can utilize the retrieved monitoring data to determine the cause of statuses and/or alarm conditions. Alternatively or additionally, the diagnostic system 120 can also employ the retrieved monitoring data to predict the development of statuses and/or alarm conditions before they arise. In further embodiments, the diagnostic system 120 can store the retrieved monitoring data for subsequent analysis. In additional embodiments, the diagnostic system 120 can transmit the retrieved monitoring data to another computing device for analysis.

In further embodiments, the condition processing circuit 266 can retrieve the selected monitoring data from the backplane 206 based upon detection of a pre-determined status. As an example, the condition processing circuit 266 can retrieve and review statuses generated by the protection processing circuit 264 to identify a status matching the pre-determined status. The identified status can also include a status time characterizing the time when the status was determined. Upon identification of a match, the condition processing circuit 266 can retrieve selected monitoring data including operating parameter measurements corresponding to the pre-determined status for time durations before and/or after the status time. In this manner, the diagnostic system 120 can be provided with operating parameter information relevant to determining the cause of the status. The pre-determined statuses and selected monitoring data can be contained within the one or more conditioning commands.

The number of condition processing circuits 266 present in the flexible monitoring system 202 can be varied independently of the number of input circuits 210$i$. In certain embodiments, condition processing circuit 266 can be added to increase the ability of the flexible monitoring system 202 to output monitoring data. As an example, when two or more condition processing circuits 266 are present in the flexible monitoring system 202, each can tasked with output of different measured operating parameters. In another example, two or more condition processing circuits 266 can output the same measured operating parameters in order to provide redundancy. Each can be beneficial under certain circumstances, providing computational flexibility to the flexible monitoring system 202. In a further example, condition processing circuits 266 can be added to implement custom analytics without interfering with standard operation (e.g., when beta-testing a new analytic).

Output circuits 2100 can be configured to obtain any monitoring data contained on the backplane 206 in response to receipt of output commands (e.g., contained in the one or more protection command signal 209$s$ received from the internal network 110$a$). The output circuits 2100 can further output the retrieved monitoring data to the internal network 110$a$ in the form of monitoring signals 206$s$. Examples of monitoring data retrieved by output circuits 2100 can include, but are not limited to, operating parameter measurements, the determined values, variables of the enhanced data set, statuses, and alarms.

In one aspect, output circuits 2100 can be in the form of proportional output circuits 270. As further illustrated in FIG. 3, the proportional output circuits 270 can be configured to output monitoring signals 206$s$ in the form of process control signals 300$s$. The process control signals 300$s$ can be proportional to process variables, such as direct measurement values or variables of the enhanced data set, as compared to a predetermined scale. As an example, a current output can be a 4-20 mA output. The process control signals 300$s$ can be provided to the machine control system 112, either directly or via the internal network 110$a$, to facilitate control of operating parameters of the target 102. The process variables included in the process control signals 300 can be specified by the protection command signal 209$s$.

In further embodiments, output circuits 2100 can be in the form of one or more relay circuits 272 configured to retrieve selected status data from the backplane 206 and to actuate based upon received alarm statuses to annunciate an alarm. Annunciated alarms can be output in the form of alarm signals 302$s$. In one example, relays can actuate based upon a single status. In another example, relays can actuate based upon predetermined Boolean expressions (e.g., AND or voting) that combine two or more statuses. The alarm signals 302$s$ can be provided to the machine control system 112 via the internal network 110$a$, or directly to the machine control system 112, to facilitate control of operating parameters of the target 102. As an example, the machine control system 112 can shut down operation of the target 102 in response to receipt of an alarm signal 302$s$. The selected status data and the logic employed for actuation of a relay can be specified by the protection command signal 209$s$.

In other embodiments, output circuits 2100 can be in the form of at least one communication interface circuits 274. The communication interface circuit 274 can be configured to retrieve selected monitoring data from the backplane 206 in response to receipt of the protection command signal 209s. The selected monitoring data can include one or more of the measured operating parameters, the measured variables of the enhanced data set, determined statuses, and determined alarms. The retrieved data can be transmitted to the internal network 110a in one or more return signals 306s for use by machine control system 212 (e.g., for process control), the HMI 114 (e.g., display to an operator) and/or stored by the historian 116.

Infrastructure circuits 210n can be configured to perform functionality required for the flexible monitoring system 202 to operate. With continued reference to FIG. 2B, in one aspect, infrastructure circuits 210n can take the form of a system interface circuit 276. The system interface circuit 276 can function as an access point for transmission of protection command signals 209s from the internal network 110a to the monitoring system 220, facilitating configuration of the circuits involved in protection monitoring (e.g., protection processing circuit 264, output circuits 2100). The protection command signals 209s can include one or more signals including any of the following in any combination: identification of selected monitoring data for each of the protection processing circuit 264 and output circuits 2100 to retrieve and/or output, alarm set points for the protection processing circuit 264, and logic for annunciation of relays by relay output circuits 272.

It can be appreciated that, in contrast to the monitoring system 106, embodiments of the flexible monitoring system 202 can separate the circuits 210 that configure protection monitoring functions (e.g., the system interface circuit 276) and condition monitoring functionality (e.g., the condition processing circuit 266). As a result, protection monitoring configuration can be performed entirely on the internal network 110a while condition monitoring configuration can be performed entirely on the external network 110b. That is, the internal network 110a is not communicatively coupled to the external network 110b. As a result, conditioning command signals 211s can be provided to the condition processing circuit 266 without the need to obtain approval from an authorized operator of the machine control system 112.

In appreciation of cybersecurity risks inherent in allowing the condition processing circuit 266 to communicate with the external network 110b and the backplane 206, the condition processing circuit 266 can be limited to unidirectional communication with the backplane 206 for data retrieval only. Such unidirectional communication can be established by any combination of hardware (e.g., data diodes), firmware, and/or software. In certain embodiments, this unidirectional communication is provided at least through hardware. As a result, the flexible monitoring system 202 can be kept secure from malicious actors while facilitating rapid configuration of the condition processing circuit 266.

In another aspect, infrastructure circuits 210n can take the form of power input circuits 280. Power input circuits 280 can provide the ability to connect one or more power sources to the flexible monitoring system 202.

In a further aspect, infrastructure circuits 210n can take the form of bridge circuits 282. The bridge circuits 282 can provide the ability to connect the backplanes 206 of two or more bases 204 together and to form the common backplane 206' for communication therebetween.

So configured, embodiments of the circuits 210 can be arranged in any combination distributed amongst one or more bases 204 to form implementations of the flexible monitoring system having desired monitoring capabilities (e.g., input, processing, output, etc.). Exemplary embodiments of flexible monitoring systems 202 constructed from different groupings of circuits 210 and bases 204 to provide different monitoring functions are discussed in greater detail in U.S. patent application Ser. No. 15/947,762, filed Apr. 6, 2018, entitled "Monitoring Systems For Industrial Machines Having Dynamically Adjustable Computational Units," the entirety of which is incorporated by reference.

In general, it can be desirable to provide operators of the flexible monitoring system 202 with a variety of different mechanisms for obtaining information from the flexible monitoring system 202. As discussed above, circuits 210 the flexible monitoring system 202 can be configured to output the monitoring signals 206s, 208s to the internal and external networks 110a, 110b and receive command signals 209s, 211s from the internal and external networks 110a, 110b. However, it can be desirable for operators of the flexible monitoring system 202 to access at least a portion of the monitoring signals 206s, 208s, and/or information regarding the operation of individual circuits 220 to operators that are physically present at location of the flexible monitoring system.

Figure 4A:
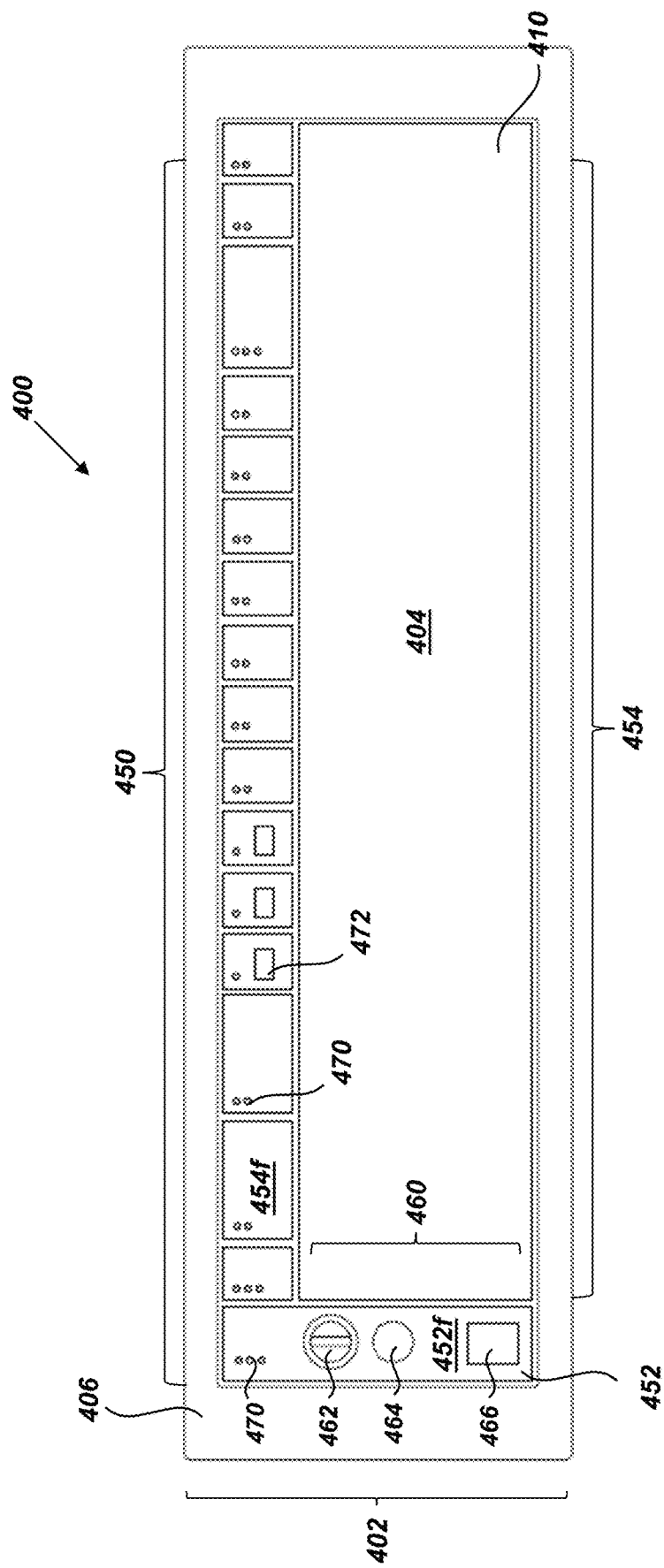
FIG. 4A is a diagram illustrating one exemplary embodiment of a front face of an interface panel of the flexible monitoring system of FIGS. 2A-3.
Figure 4B:
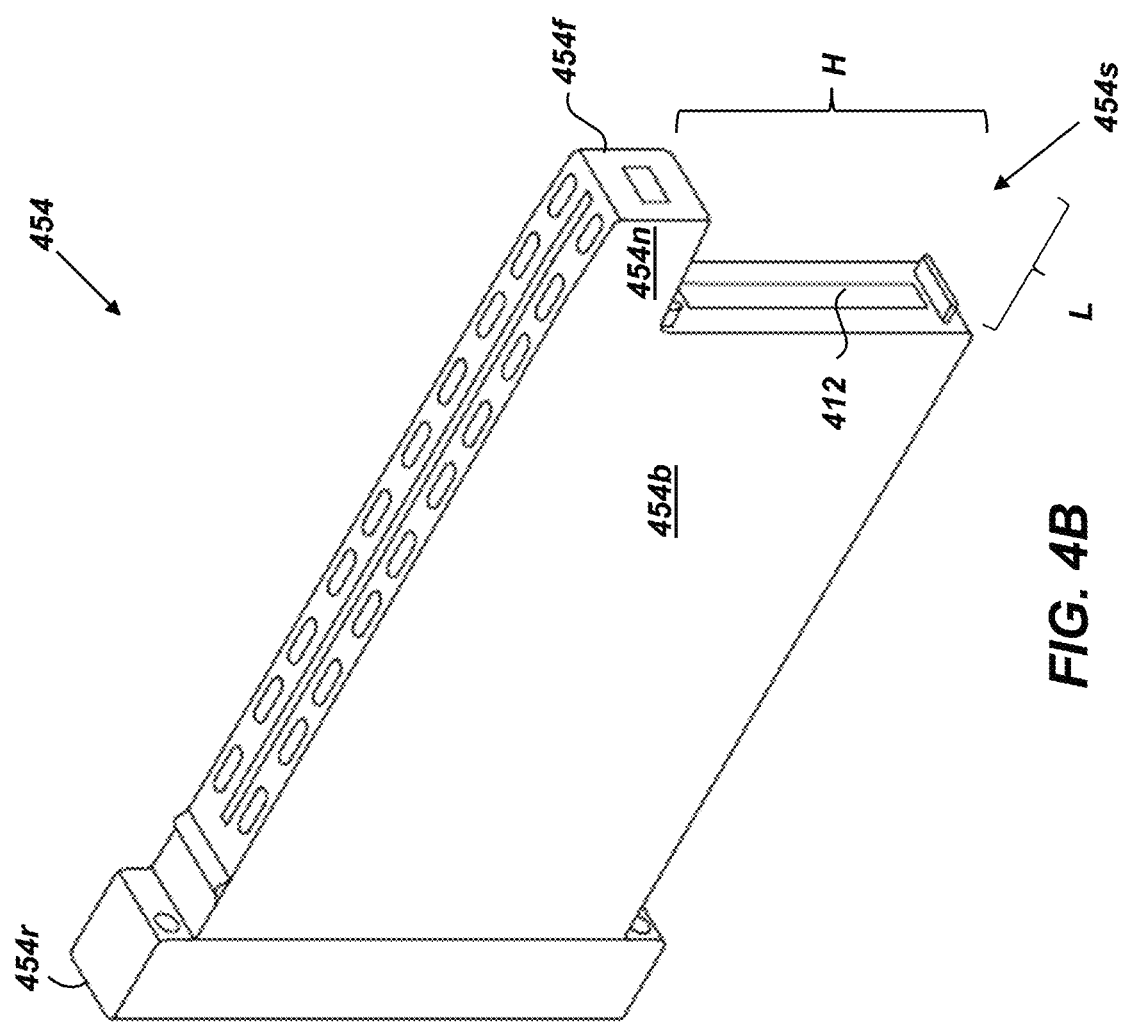
FIG. 4B is a diagram illustrating a perspective view of one exemplary embodiment of an card configured for use with the interface panel of FIG. 4A.
Figure 4C:
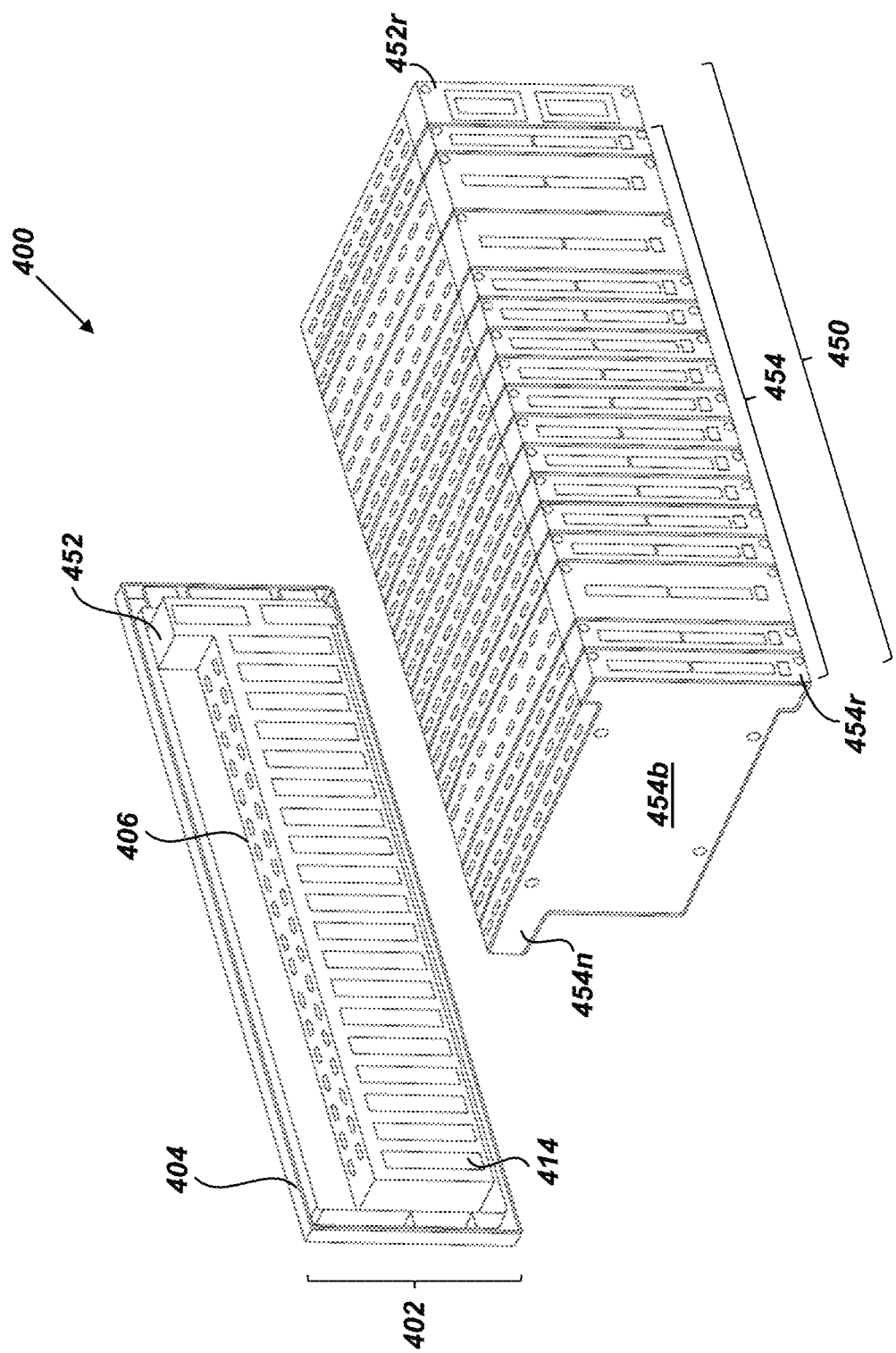
FIG. 4C is a diagram illustrating a rear-facing, perspective exploded view of the interface panel of FIG. 4A.
Figure 4D:
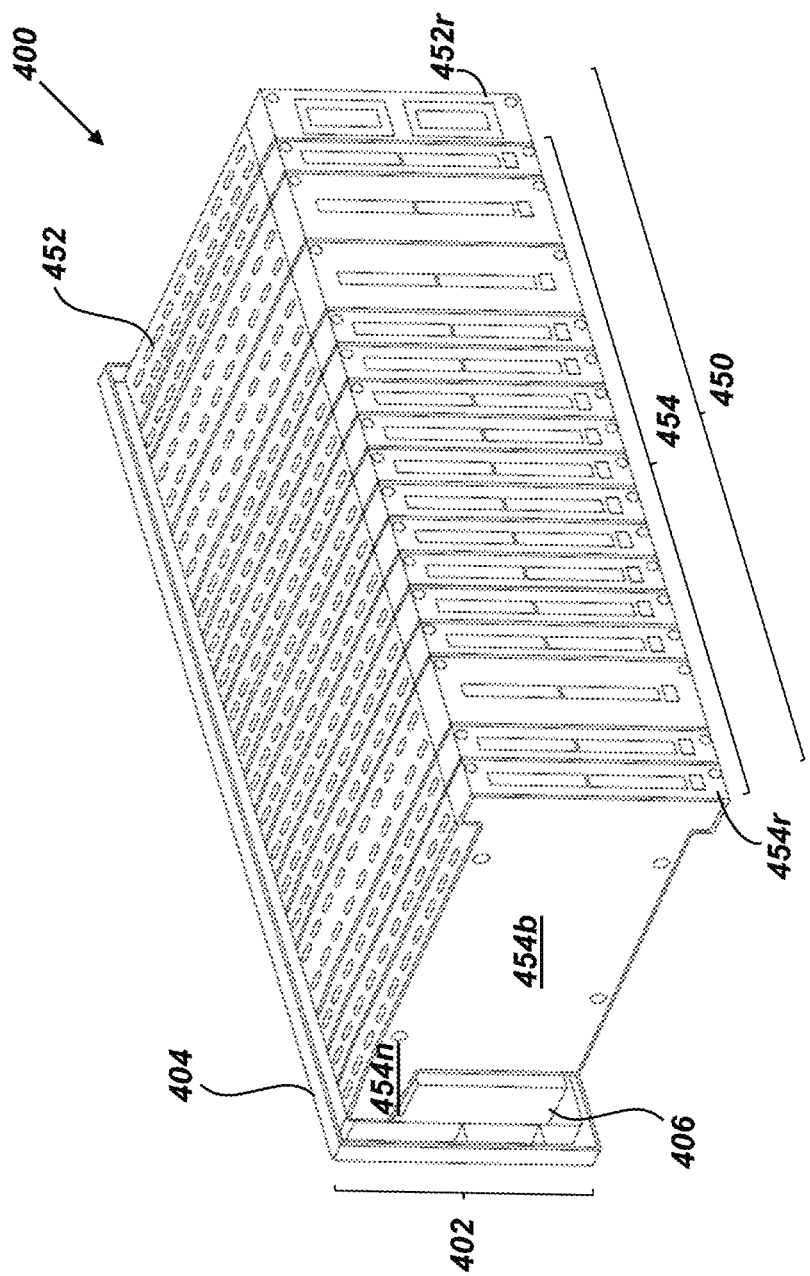
FIG. 4D is a diagram illustrating a rear-facing, perspective assembled view of the interface panel of FIG. 4A.

FIGS. 4A-4D illustrate further embodiments of the flexible monitoring system 202 in the form of flexible monitoring system 400 including an instrument panel 402 that is configured to provide such access. The instrument panel 402 be configured to accommodate at least one HMI 404 and a portion of the plurality of circuits 210 in the form of cards 450. FIG. 4A is a front view of one exemplary embodiment of the instrument panel 402. FIG. 4B is a perspective view of one exemplary embodiment of card 450 configured for use with the flexible monitoring system 400. FIG. 4C is an exploded rear view of the instrument panel 402 and a plurality of the cards 450. FIG. 4D is an assembled rear view of the instrument panel 402 and the plurality of cards 450.

The instrument panel 402 can include a bezel or frame 406 that defines an opening 410 extending in horizontal and vertical directions and configured to accommodate a front-facing portion of the HMI 404 and front faces of the plurality of cards 450. The plurality of cards 450 can include one or more first cards 452 and one or more second cards 454. As shown in FIG. 4A, a front face 452f of the first cards 452 can extend over a full height (e.g., vertical dimension) of the frame 406. That is, a vertical dimension of the front face 452f of the first cards 452 can be approximately equal to the vertical dimension of the opening 410. Front faces 454f of the second cards 454 can occupy less than the full height of the frame 406. That is, a vertical dimension of the front face 454f of the second cards 452 can be less than the vertical dimension of the opening 410. However, in alternative embodiments, not shown, the front face of the first cards can be of approximately the same height as the second cards. The portion of the frame 406 not occupied by the front faces 452f and 454f of the first and second cards 452, 454 can be occupied by the HMI 404. In certain embodiments, the one or more first cards can be a power input circuit 280 (PI). Further data connection interfaces (not labeled) can be present on rear faces 452r and 454r of the first and second cards 452, 454.

The HMI 404 can be any device configured to permit an operator of the flexible monitoring system to receive information from the flexible monitoring system 202 (e.g., review measured operating parameters). As an example, the HMI 404 can be a display that is touch sensitive and/or is in further communication with physical input object (e.g., buttons, joysticks, etc.) The HMI 404 can also be configured to transmit operator input to the flexible monitoring system 202 (e.g., a selection of measured monitoring parameters output by one or more of the cards 450 to be displayed by the HMI 404).

The cards 450 can also include one or more features 460 configured to provide information regarding operation of the cards 450 and/or to provide commands to the cards 450. As an example, under circumstances where the first card 452 is a power input circuit 280, the features 460 can include a key 462, a power on/off selector 464, and/or a reset selector 466. The key 462 can be configured to enable actuation of the remaining features 460 of the power input circuit 280 in an unlocked or armed state (first key position) and disable actuation of the remaining features 462 of the power input circuit 280 in an locked or disarmed state (second key position).

In another example, at least one of the plurality of second cards 454 can include features 460 in the form of one or more lights 466 configured to indicate status of respective ones of the cards 450 by color and/or duty cycle (e.g., on or off state and duration thereof). Statuses could include power on/off, normal operation, disabled, error, etc. Beneficially, such lights 466 can provide an operator with the status of the cards 450 at a glance.

In a further example, features 460 can include one or more front-facing data interfaces 472. Such interfaces 472 can be a standard communication port (e.g., an Ethernet port, USB port, etc.) By connecting a computing device (e.g., a laptop or other portable computing device) to the data interface 472, the operator can directly receive monitoring signals 106s, 108s output by the cards 450.

As further illustrated in FIGS. 4B-4D, the cards 450 can have a profile that is generally elongated, with the width dimension (e.g., horizontal direction) significantly less than the height or depth direction (e.g., the depth direction can extend into the page when viewing the plurality of cards from the front face 450f, 280f). The second cards 454 can include a body 454b and a nose 454n projecting outward (e.g., forward) from the body 454b, where the front face 454f of the second cards 454 positioned on the nose 454n. The second cards 454 can further include space 454s adjacent to the nose 454n. The space 454s can have a length L defined between the front face 454f and the body 454b, and a height H defined from an inward facing surface of the nose 454n (e.g., a bottom surface) to an opposing side of the second card 454n (e.g., a bottom surface). So configured, the nose 454n of the second cards 454 can further be positioned within the frame 406 such that the front face 454f of the nose 454n is visible within the frame 406, as illustrated in FIG. 4A.

As further illustrated in FIGS. 4B-4C, the space 454s can accommodate at least a portion of the HMI. As an example, the space 454s can be dimensioned to receive a depth of the HMI 404 extending rearward (e.g., in a direction opposite the front face 454f). The second cards 454 can each include one or more first connectors 412 mounted to the body 454b and configured to couple to corresponding second data connectors 414 positioned on the rear-facing side of the HMI 404. When the flexible monitoring system 202 is assembled, as shown in FIG. 4D, the second cards 454 can be communicatively coupled to the HMI 404 and form a data transmission pathway via interconnection of the first and second data connectors 412 and 414. In this manner, selected data received and/or generated by the second cards 454 can be output to the HMI 404 (e.g., for display). Furthermore, user input(s) provided via the HMI 404 can be transmitted to the second cards 454.

Embodiments of the flexible monitoring system 400 can adopt a variety of configurations by rearranging the relative positions of the first cards 452, second cards 452, and the HMI 404. In the embodiment of FIGS. 4A-4D, the first card 452 is positioned on (e.g., in contact with or adjacent to) a first side (e.g., a left side) of the frame 406, the second cards 454 are positioned inward (e.g., rightward) of the first card 452 such that the nose 454n of respective ones of the second cards 454 are adjacent to the top of the frame 406. The HMI 404 is positioned rightward of the first card 452 and below the second cards 454, adjacent the bottom of the frame 406.

Figure 5:
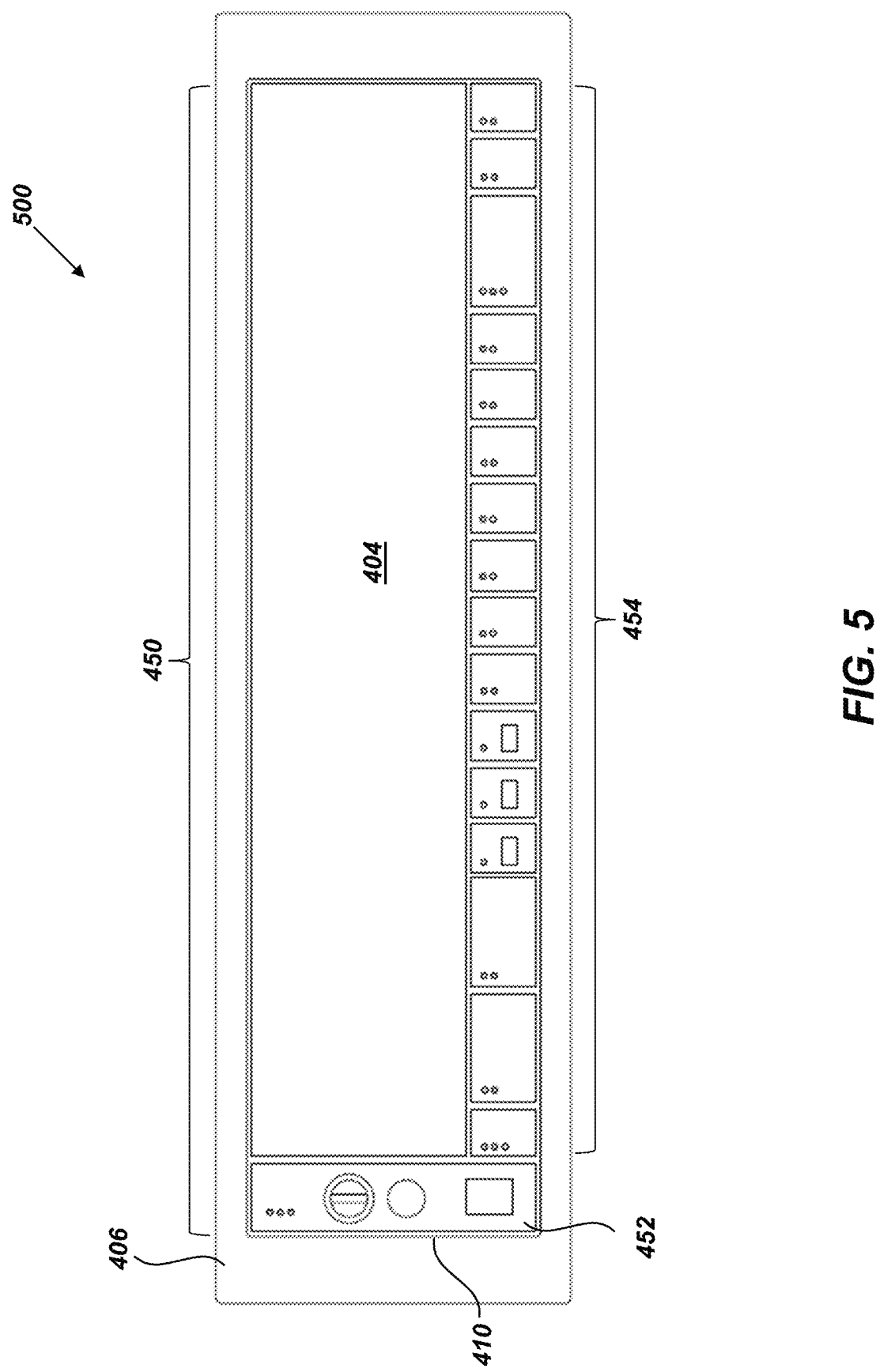
FIG. 5 is a diagram illustrating a front view of a second exemplary embodiment of an interface panel of the flexible monitoring system of FIG. 2A.

In the embodiment of FIG. 5, an embodiment of the flexible monitoring system 400 in the form of flexible monitoring system 500. As shown, the first card 452 remains positioned on (e.g., in contact with or adjacent to) the first side (e.g., the left side) of the frame 406, with the second cards 454 and HMI 404 positioned inward (e.g., rightward) of the first card 452. However, the vertical position of the second cards 454 and HMI 404 are reversed. That is the second cards 454 are positioned such that the nose 454n of respective ones of the second cards 454 are adjacent to the bottom of the frame 406 and the HMI 404 is positioned adjacent to the top of the frame 406.

Figure 6:
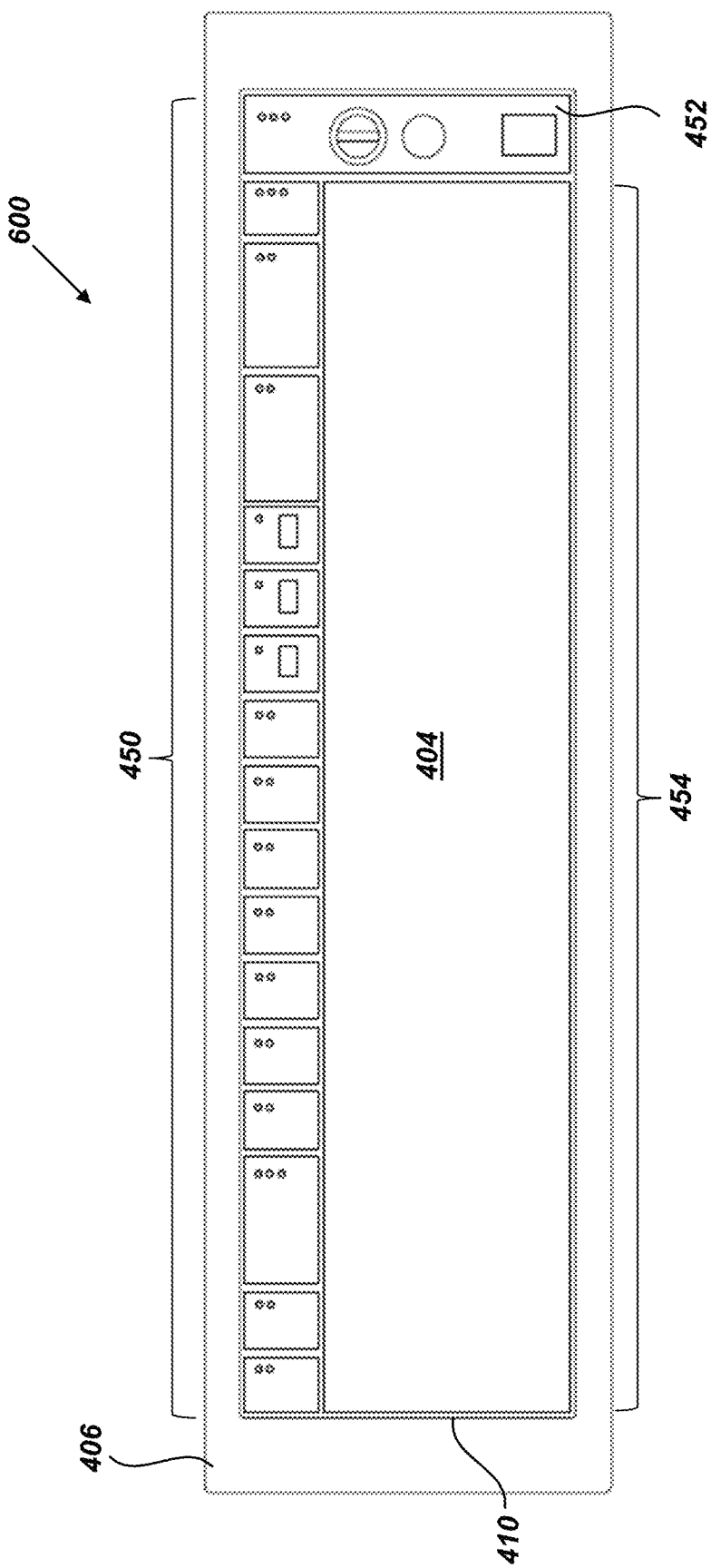
FIG. 6 is a diagram illustrating a front view of a third exemplary embodiment of an interface panel of the flexible monitoring system of FIG. 2A.

In the embodiment of FIG. 6, an embodiment of the flexible monitoring system 400 in the form of flexible monitoring system 600. As shown, the first card 452 is positioned on (e.g., in contact with or adjacent to) a second side (e.g., a right side) of the frame 406, with the second cards 454 and HMI 404 positioned inward (e.g., leftward) of the first card 452. The second cards 454 are positioned such that the nose 454n of respective ones of the second cards 454 are adjacent to the top of the frame 406 and the HMI 404 is positioned adjacent to the bottom of the frame 406.

Figure 7:
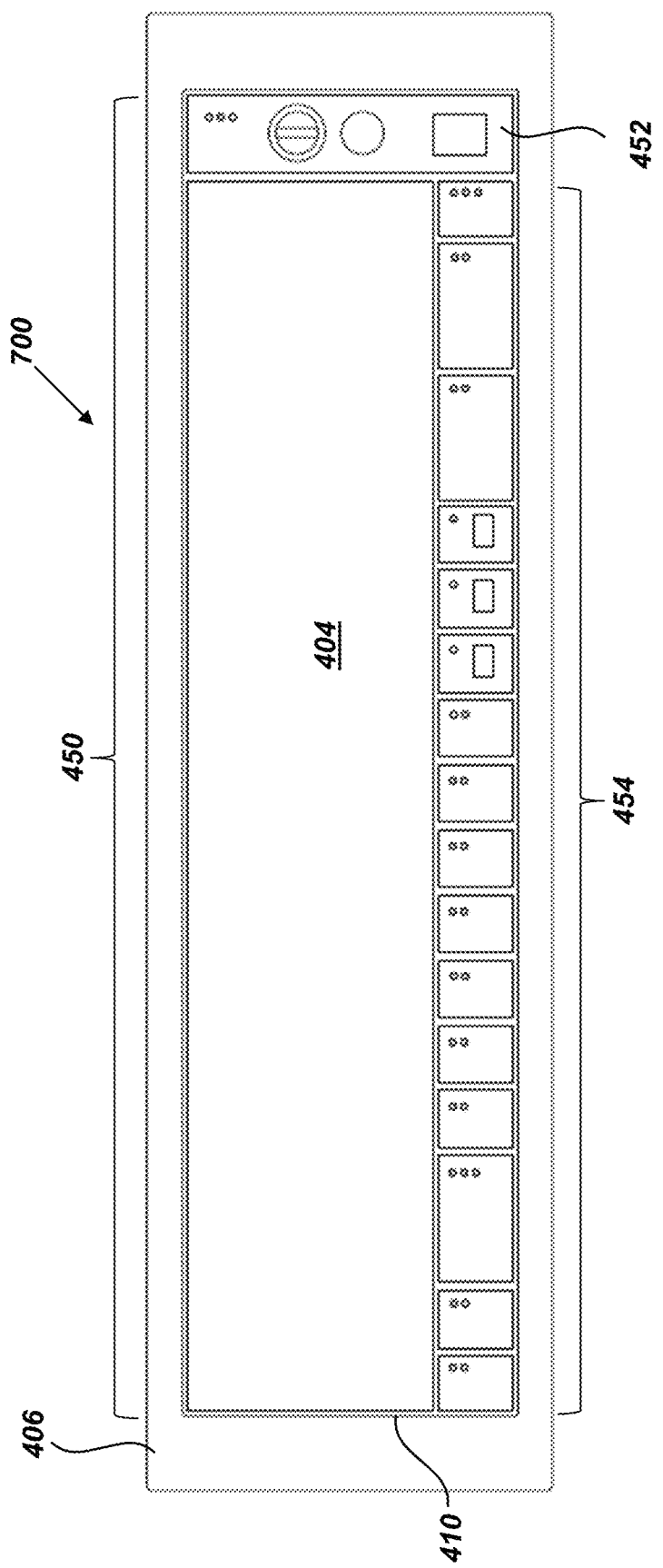
FIG. 7 is a diagram illustrating a front view of a fourth exemplary embodiment of an interface panel of the flexible monitoring system of FIG. 2A.

In the embodiment of FIG. 7, an embodiment of the flexible monitoring system 400 in the form of flexible monitoring system 700. As shown, the first card 452 is positioned on (e.g., in contact with or adjacent to) the second side (e.g., the right side) of the frame 406, with the second cards 454 and HMI 404 positioned inward (e.g., leftward) of the first card 452. The second cards 454 are positioned such that the nose 454n of respective ones of the second cards 454 are adjacent to the bottom of the frame 406 and the HMI 404 is positioned adjacent to the top of the frame 406.

Figure 8:
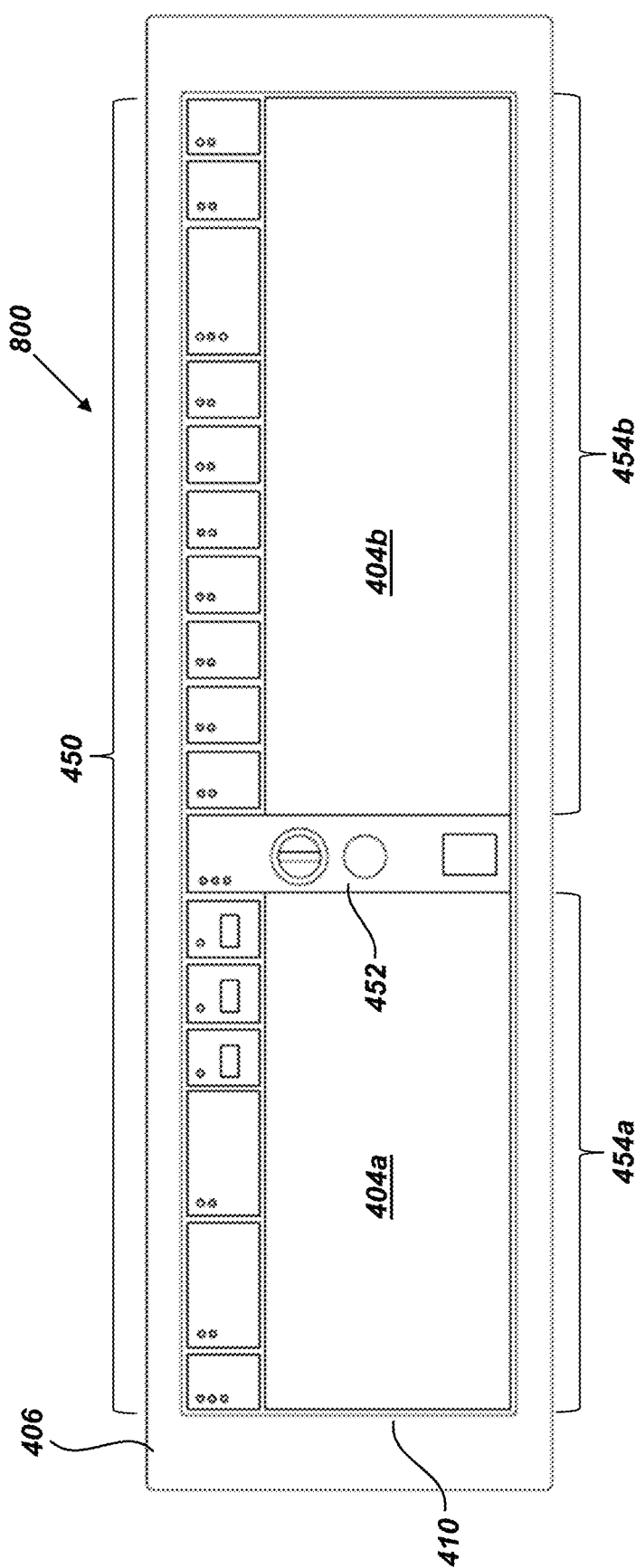
FIG. 8 is a diagram illustrating a front view of a fifth exemplary embodiment of an interface panel of the flexible monitoring system of FIG. 2A.

In the embodiment of FIG. 8, an embodiment of the flexible monitoring system 400 in the form of flexible monitoring system 800. As shown, the first card 452 is distanced (e.g., positioned inwards) from the right and left sides of the frame 406. First portions 454a of the second cards 454 and a first HMI 404a are positioned leftwards of the first card 452. That is, the first portions 454a of the second cards 454 and the first HMI 404a are interposed between the first card 452 and the left side of the frame 406. Second portions of the second cards 454b and a second HMI 404b are positioned rightwards of the first card 452. That is, the second portions 454b of the second cards 454 and the second HMI 404b are interposed between the first card 452 and the right side of the frame 406. The first and second portions 454a, 454b of the second cards 454 are positioned adjacent the top of the frame 406. The first and second portions 404a, 404b of the HMI 404 are positioned adjacent the bottom of the frame 406, below the first and second portions 454a, 454b of the second cards 454.

Figure 9:
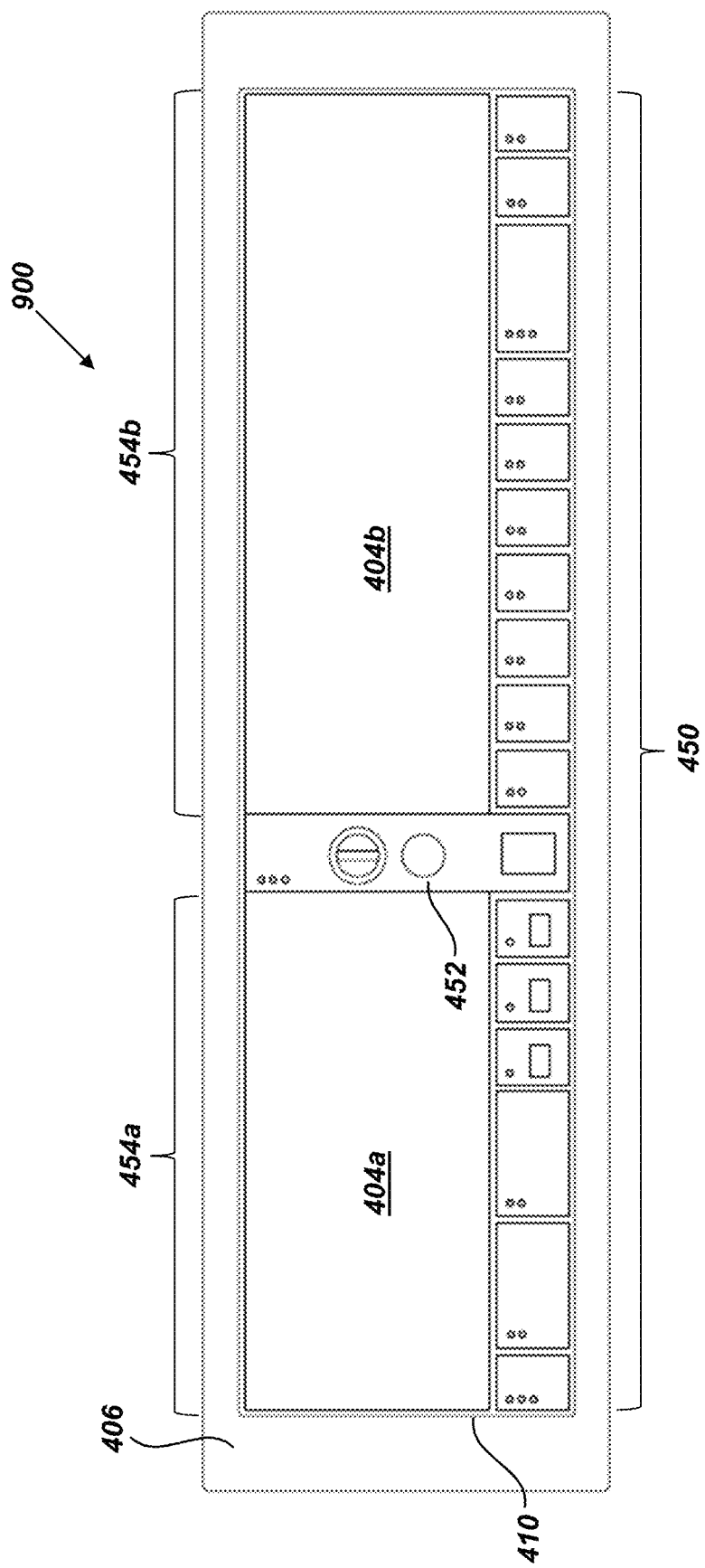
FIG. 9 is a diagram illustrating a front view of a second exemplary embodiment of an interface panel of the flexible monitoring system of FIG. 2A.

In the embodiment of FIG. 9, an embodiment of the flexible monitoring system 400 in the form of flexible monitoring system 900. As shown, the first card 452 is distanced (e.g., positioned inwards) from the right and left sides of the frame 406. First portions 454a of the second cards 454 and a first HMI 404a are positioned leftwards of the first card 452. That is, the first portions 454a of the second cards 454 and the first HMI 404a are interposed between the first card 452 and the left side of the frame 406. Second portions of the second cards 454b and a second HMI 404b are positioned rightwards of the first card 452. That is, the second portions 454b of the second cards 454 and the second HMI 404b are interposed between the first card 452 and the right side of the frame 406. The first and second portions 454a, 454b of the second cards 454 are positioned adjacent the bottom of the frame 406. The first and second portions 404a, 404b of the HMI 404 are positioned adjacent the top of the frame 406, above the first and second portions 454a, 454b of the second cards 454.

Exemplary technical effects of the methods, systems, and devices described herein include, by way of non-limiting example an improved instrumental panel for a flexible monitoring system.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:

1. An instrument panel, comprising:
   a frame housing a plurality of cards, each card having a front face, a rear face, one or more circuits, and a data connection interface in electrical communication with the one or more circuits, the plurality of cards including,
      one or more first cards, wherein the front face of the first cards extends fully over a height of the frame, and a width of the front face of the first cards is less than the height of the frame, and
      one or more second cards, having a body, a nose projecting forward from the body and defining the front face of the one or more second cards, wherein the front face of the second cards extends over a portion of the height of the frame, and a width of the front face of the second cards is less than the height of the frame;
   wherein the one or more first cards include a front data connection interface on the front face and a rear data connection interface on the rear face,
   wherein the one or more first cards are interchangeable such that the front face or the rear face of the first cards is visible within an opening of the frame, and
   wherein the one or more second cards are positioned such that the nose is visible within the opening of the frame.

2. The instrument panel of claim 1, wherein the one or more first cards includes a power input circuit.

3. The instrument panel of claim 1, further comprising a human machine interface (HMI) including a front face with a display received within a portion of the opening of the frame.

4. The instrument panel of claim 3, wherein the one or more second cards further comprise a first data connector mounted to the body and configured to couple to a second data connector mounted to the HMI to form a data connection pathway for exchange of data between the one or more second cards and the HMI.

5. The instrument panel of claim 3, wherein the front faces of respective cards of the one or more first cards and the one or more second cards, and the HMI are positioned within the opening such that
   the one or more first cards are positioned adjacent to a left side of the frame;
   the one or more second cards are positioned right of the first cards with the nose of respective ones of the second cards adjacent to a top or a bottom of the frame; and
   the HMI is positioned right of the one or more first cards and below the second cards.

6. The instrument panel of claim 3, wherein the front faces of respective cards of the one or more first cards and the one or more second cards, and the HMI are positioned within the opening such that
   the one or more first cards are positioned adjacent to a right side of the frame;
   the one or more second cards are positioned left of the first cards with the nose of respective ones of the second cards adjacent to a top or a bottom of the frame; and
   the HMI is positioned left of the one or more first cards and above the second cards.

7. The instrument panel of claim 3, wherein the front faces of respective cards of the one or more first cards and the one or more second cards, and the HMI are positioned within the opening such that
   the one or more first cards are positioned inward from the right and left sides of the frame;
   the one or more second cards include a plurality of second cards, wherein a first portion of the plurality of second cards is positioned left of the first cards and a second portion of the plurality of second cards is positioned right of the first cards, and wherein the nose of respective ones of the plurality of second cards are adjacent to a top of the frame; and
   further comprising a first HMI and a second HMI, wherein the first HMI is positioned right of the first cards, the second HMI is positioned left of the one or more first cards, and the first and second HMI are positioned below the plurality of second cards.

8. The instrument panel of claim 3, wherein the front faces of respective cards of the one or more first cards and the one or more second cards, and the HMI are positioned within the opening such that
   the one or more first cards are positioned inward from the right and left sides of the frame;
   the one or more second cards include a plurality of second cards, wherein a first portion of the plurality of second cards is positioned left of the first cards and a second portion of the plurality of second cards is positioned right of the first cards, and wherein the nose of respective ones of the second cards are adjacent to a bottom of the frame; and
   further comprising a first HMI and a second HMI, wherein the first HMI is positioned right of the first cards, the second HMI is positioned left of the one or more first cards, and the first and second HMI are further positioned above the plurality of second cards.

9. The instrument panel of claim 1, wherein at least one card of the one or more second cards includes one or more lights positioned on the front face of the at least one second card, the one or more lights in communication with the one or more circuits and configured to indicate a status of the at least one second card based on a duty cycle of the at least one second card.

10. The instrument panel of claim 1, wherein at least card of the one or more second cards includes the data connection interface positioned on the front face.

11. A flexible monitoring system, comprising:
an instrument panel including a frame including at least two bases housing at least two backplanes therein, the at least two backplanes including a plurality of circuits communicatively coupled to at least one sensor configured to sense an operating parameter of a target, the at least two bases further defining a data communication interface,
wherein at least a portion of the plurality of circuits are configured on one or more first cards, wherein a front face of the one or more first cards extends fully over a height of the frame, and a width of the of the front face of the one or more first cards is less than the height of the frame,
wherein at least a portion of the plurality of circuits are configured on one or more second cards, the one or more second cards having a body, a nose projecting forward from the body and defining a front face of the one or more second cards, wherein the front face of the one or more second cards extends over a portion of the height of the frame, and a width of the front face of the one or more second cards is less than the height of the frame,
wherein the one or more first cards include a front data connection interface and a rear data connection interface that are interchangeable such that the front data connection interface or rear data connection interface of the one or more first cards is visible within the opening of the frame, and
wherein the one or more second cards are positioned such that the nose is visible within the opening of the frame and adjacent to the bottom of the frame.

12. The flexible monitoring system of claim 11, wherein the plurality of circuits includes a plurality of bridge circuits.

13. The flexible monitoring system of claim 12, wherein the plurality of bridge circuits are in electrical communication with the at least two backplanes, and wherein at least one card of the one or more second cards includes a rear face and the one or more data connection interfaces are positioned on the front face or the rear face and are in communication with the one or more circuits.

14. The flexible monitoring system of claim 13, wherein at least one card of the one or more second cards includes one or more lights positioned on the front face of the at least one second card, the one or more lights in communication with the one or more circuits and configured to indicate a status of the at least one second card based on a duty cycle of the at least one second card.

15. The flexible monitoring system of claim 11, wherein one base of the at least two bases comprise a human machine interface (HMI) including a display received within a portion of the opening the frame.

16. The flexible monitoring system of claim 15, wherein the one or more second cards further comprise a first data connector mounted to a body of the one or more second cards and configured to couple to a second data connector mounted to the HMI to form a data connection pathway for exchange of data between the one or more second cards and the HMI.

17. The flexible monitoring system of claim 15, wherein the front faces of respective cards of the one or more first cards, the one or more second cards, and the HMI are positioned within the opening such that
the one or more first cards are positioned adjacent to a left side of the frame;
the one or more second cards are positioned right of the first cards with the nose of respective ones of the second cards adjacent to a top or a bottom of the frame; and
the HMI is positioned right of the one or more first cards and below the second cards.

18. The flexible monitoring system of claim 15, wherein the front faces of respective cards of the one or more first cards and the one or more second cards, and the HMI are positioned within the opening such that
the one or more first cards are positioned adjacent to a left side of the frame;
the one or more second cards are positioned right of the first cards with the nose of respective ones of the second cards adjacent to a top of the frame; and
the HMI is positioned right of the one or more first cards and below the second cards.

19. The flexible monitoring system of claim 15, wherein the front faces of respective cards of the one or more first cards and the one or more second cards, and the HMI are positioned within the opening such that
the one or more first cards are positioned adjacent to a right side of the frame;
the one or more second cards are positioned left of the first cards with the nose of respective ones of the second cards adjacent to a top or a bottom of the frame; and
the HMI is positioned left of the one or more first cards and above the second cards.

20. The flexible monitoring system of claim 15, wherein the front faces of respective cards of the one or more first cards and the one or more second cards, and the HMI are positioned within the opening such that
the one or more first cards are positioned inward from right and left sides of the frame;
the one or more second cards include a plurality of second cards, wherein a first portion of the plurality of second cards is positioned left of the first cards and a second portion of the plurality of second cards is positioned right of the first cards, and wherein the nose of respective ones of the plurality of second cards are adjacent to a top or a bottom of the frame; and
further comprising a first HMI and a second HMI, wherein the first HMI is positioned right of the first cards, the second HMI is positioned left of the one or more first cards, and the first and second HMI are further positioned below the second cards.

* * * * *